United States Patent
Nagayama et al.

(10) Patent No.: US 7,776,645 B2
(45) Date of Patent: Aug. 17, 2010

(54) ORGANIC SEMICONDUCTOR DEVICE AND ITS MANUFACTURING METHOD

(75) Inventors: Kenichi Nagayama, Tsurugashima (JP); Tatsuya Yoshizawa, Tsurugashima (JP); Masahiro Shiratori, Tsurugashima (JP)

(73) Assignee: Pioneer Corporation, Tokyo (JP)

( * ) Notice: Subject to any disclaimer, the term of this patent is extended or adjusted under 35 U.S.C. 154(b) by 857 days.

(21) Appl. No.: 10/559,469

(22) PCT Filed: Jun. 2, 2004

(86) PCT No.: PCT/JP2004/007991

§ 371 (c)(1), (2), (4) Date: Apr. 28, 2006

(87) PCT Pub. No.: WO2004/110105

PCT Pub. Date: Dec. 16, 2004

(65) Prior Publication Data

US 2006/0246620 A1 Nov. 2, 2006

(30) Foreign Application Priority Data

Jun. 6, 2003 (JP) .............................. 2003-161669

(51) Int. Cl.
*H01L 51/40* (2006.01)
(52) U.S. Cl. .............................. 438/99; 257/40; 257/72; 438/149
(58) Field of Classification Search ............. 257/40, 257/72; 438/99, 149
See application file for complete search history.

(56) References Cited

U.S. PATENT DOCUMENTS

2001/0049030 A1    12/2001    Okada et al.

FOREIGN PATENT DOCUMENTS

| JP | 02-033131 | 2/1990 |
|---|---|---|
| JP | 08-018125 | 1/1996 |
| JP | 02628072 | 4/1997 |
| JP | 09-115672 | 5/1997 |
| JP | 10-022072 | 1/1998 |
| JP | 10-208883 | 8/1998 |
| JP | 11-144865 | 5/1999 |
| JP | 2001-110566 | 4/2001 |
| JP | 2002-015861 | 1/2002 |
| JP | 2002-170669 | 6/2002 |
| JP | 2002-518844 | 6/2002 |
| JP | 2002-216976 | 8/2002 |
| JP | 2002-299050 | 10/2002 |
| JP | 2003-036037 | 2/2003 |
| JP | 2003-332073 | 11/2003 |
| JP | 2004-006278 | 1/2004 |
| JP | 2004-014236 | 1/2004 |
| WO | WO 01/45140 A2 | 6/2001 |

OTHER PUBLICATIONS

Machine Translation of JP 11-144865.*
C. C. Wu et al., "Integrated three-color organic light-emitting devices", Appl. Phys. Lett., vol. 69, No. 21, pp. 3117-3119, Nov. 18, 1996.

* cited by examiner

*Primary Examiner*—Eugene Lee
*Assistant Examiner*—Anthony Ho
(74) *Attorney, Agent, or Firm*—Drinker Biddle & Reath LLP

(57) ABSTRACT

An organic semiconductor device in which an organic semiconductor layer is easily formed into a pattern, and a method of manufacturing same. On a substrate, a first structural portion including a first electrode, an organic semiconductor layer made of an organic compound having a semiconductor property, and a second structural portion having a second electrode are provided in order. The second structural portion is formed in a prescribed pattern. The second structural portion includes a mask portion having an etching-resistant property, and etching of the organic semiconductor layer is performed while using the mask portion as a mask. The mask portion may be the second electrode.

2 Claims, 13 Drawing Sheets

ORGANIC SEMICONDUCTOR DEVICE AND ITS MANUFACTURING METHOD

BACKGROUND OF THE INVENTION

1. Field of the Invention

This invention relates to an organic semiconductor device including an organic compound having a semiconductor property, and a method of manufacture thereof.

2. Description of the Related Art

A photoetching method, an evaporation deposition method employing a mask or the like is known as a method of forming a thin film pattern made of an inorganic or organic material.

The photoetching method is a method in which, after forming a thin film on a substrate, photoresist is formed in a prescribed pattern on the thin film, and the portions of the thin film not covered by the resist are removed by wet etching or by dry etching, after which the resist is stripped away, to form a thin film pattern.

The evaporation deposition method using a mask is a method in which a mask having a pattern with prescribed openings is placed flush against the substrate, the thin film material is deposited by evaporation deposition through the openings, and the mask is removed, to form a thin film pattern on the substrate.

The above methods are used to form LSI and other semiconductor devices, as well as LCDs, organic electroluminescence (hereafter "organic EL") displays, other display devices, or the like.

When stacking a plurality of layers of thin films having patterns using the above-described thin film formation methods of the prior art, a process to remove the mask or resist is necessary each time the thin film is formed.

Because a solvent or other chemical is used to remove resist, when the thin film material lacks resistance to chemicals, it is difficult to form a layer pattern from such thin film materials using a photoetching method.

When removing a mask, evaporation-deposited material adhering to the mask falls away from the mask, and this material may contaminate the thin film.

The above-described problems are presented as an example of problems to be solved by this invention.

SUMMARY OF THE INVENTION

An organic semiconductor device according to a first aspect of this invention is a semiconductor device, including a first structural portion having a first electrode; an organic semiconductor layer made of an organic compound having a semiconductor property; and a second structural portion confronting said first structural portion via said organic semiconductor layer and having a second electrode; wherein said second structural portion has a mask portion made of a material having an etching-resistant property, wherein said organic semiconductor layer is formed in a pattern by etching while using said mask portion as a mask.

An organic semiconductor device manufacturing method according to a second aspect of this invention is a method of manufacturing an organic semiconductor device, including a first structural portion having a first electrode, an organic semiconductor layer made of an organic compound having a semiconductor property, and a second structural portion confronting said first structural portion with said organic semiconductor layer and having a second electrode, including: a first structural portion formation process of forming said first structural portion; an organic semiconductor layer formation process of forming said organic semiconductor layer on said first structural portion; and a second structural portion formation process of forming said second structural portion on said organic semiconductor layer, wherein said second structural portion formation process having a mask portion formation process of forming a mask portion made of a material having an etching-resistant property, and an etching process of etching said organic semiconductor layer while using said mask portion as a mask.

DETAILED DESCRIPTION OF THE INVENTION

Figure 1:
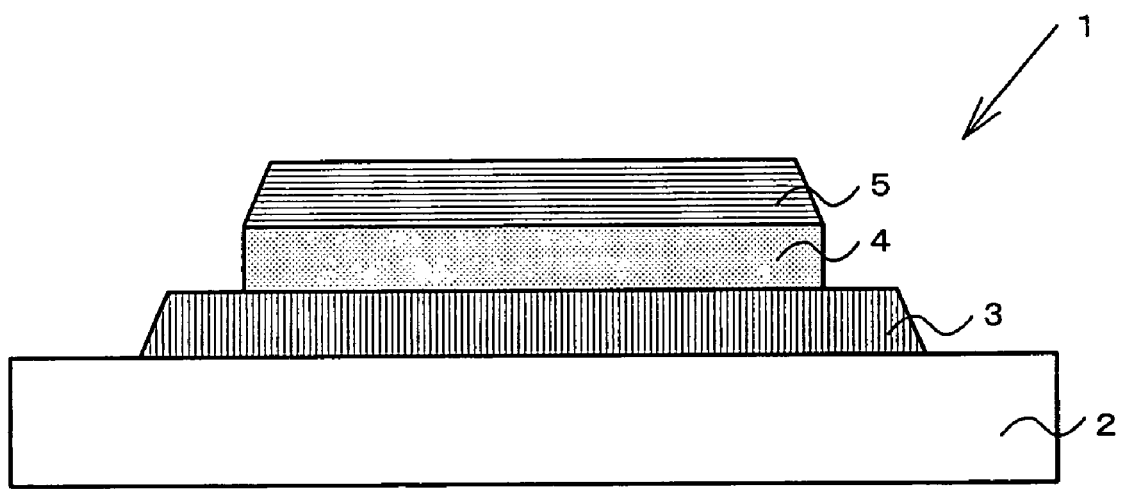
FIG. 1 is a cross-sectional view showing an organic semiconductor device of this invention.

Embodiments of this invention are explained below, while referring to the drawings.

As shown in FIG. 1, an organic semiconductor device 1 according to this invention has a substrate 2 made of a resin or other substrate material. The substrate 2 need only have an insulating property at the surface, and may for example be glass, a silicon wafer with oxidized surface, or another insulating material. The substrate 2 may have flexibility or deformability. Also, the substrate 2 may be transparent.

The first structural portion 3, including the first electrode, is provided on the substrate 2. The first electrode is made of metal or another low-resistance material. The first structural portion 3 may be made of a transparent material, and may include a protective layer made of a material having moisture resistance.

An organic semiconductor layer 4 made of an organic compound having a semiconductor property, is provided on a portion of the first structural portion 3. The organic semiconductor layer 4 may include a light-emitting layer having an electroluminescence property, and may also include a functional layer to enhance a light emission efficiency of the light-emitting layer. The functional layer may include an organic compound layer of a low-molecular-weight organic compound or of a high-molecular-weight organic compound, or may be formed by combining a layer of a low-molecular-weight compound and a layer of a high-molecular-weight compound.

The second structural portion 5, including the second electrode, is provided on the organic semiconductor layer 4. The second electrode is made of metal or other low-resistance material. The second structural portion 5 may be transparent. The second structural portion 5 may include an insulating layer having an insulating property.

The second structural portion 5 includes a mask portion made of a material which, compared with the organic semiconductor layer 3, has an excellent corrosion resistance property and other excellent etching resistance property. The mask portion may be made of metal, a metal oxide, or another inorganic compound. The second electrode may be the mask portion.

In an organic semiconductor device 1 with this configuration, the organic semiconductor layer is formed into a pattern by etching with the mask portion used as a mask. In an organic semiconductor device with such a configuration, there is no positional shift between the organic semiconductor layer and mask portion.

When the organic semiconductor layer includes a light-emitting layer, the organic semiconductor device is an organic EL device.

The second structural portion 5 may have a protective portion, provided with functions such as prevention of degradation of the organic semiconductor device. The protective portion may be made of a resin, a metal oxide, a metal nitride, or another material having moisture resistance. Also, the protective portion may be formed by stacking a plurality of layers of the materials.

Figure 2:
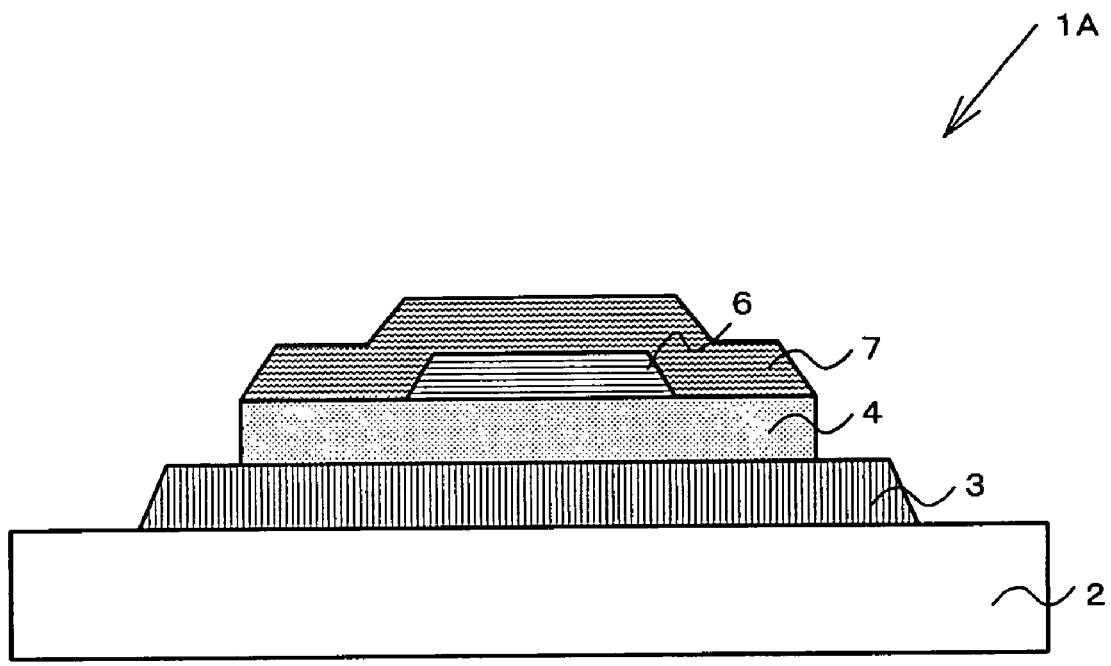
FIG. 2 is a cross-sectional view showing a modified example of an organic semiconductor device of this invention.

The protective portion may be the mask portion, as stated above. For example, as shown in FIG. 2, in the organic semiconductor device 1A the second structural portion includes the second electrode 6 and protective layer 7. Because the protective layer 7 is used as a mask to perform etching, the pattern of the organic semiconductor layer 4 can be formed to conform to the pattern of the protective layer 7. By means of this configuration, the shape of the organic semiconductor device can be changed by changing the pattern of the protective portion.

Figure 3:
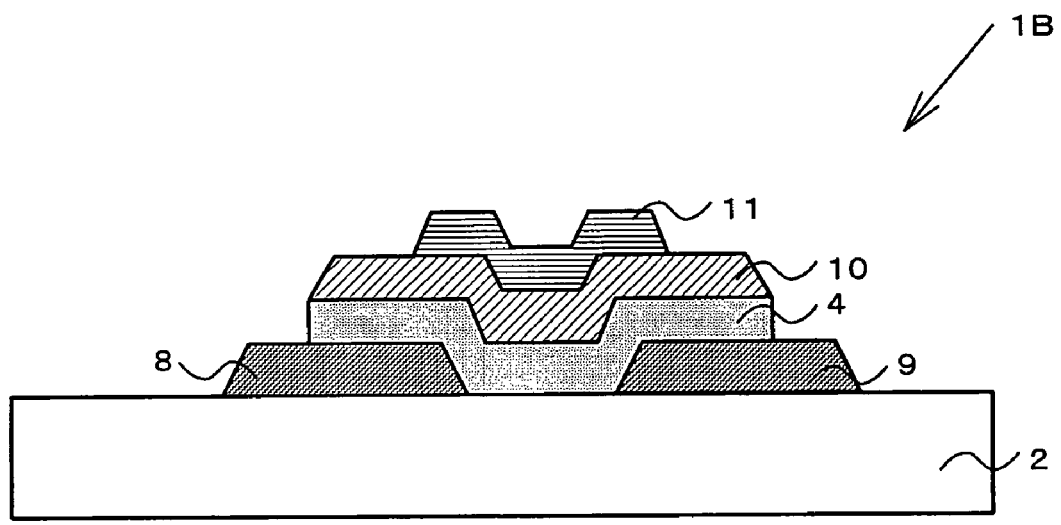
FIG. 3 is a cross-sectional view showing a modified example of an organic semiconductor device of this invention.

The first structural portion may include a plurality of electrodes. For example, as shown in FIG. 3, the first structural portion may include a first electrode 8 and a third electrode 9, with the first electrode 8 and third electrode 9 serving as a source electrode and drain electrode respectively. Also, the second structural portion may include a gate insulating layer 10 provided on the organic semiconductor layer 4 and a gate electrode 11 provided on the gate insulating layer 10. An organic semiconductor device with this configuration is an organic thin film transistor (hereafter "organic TFT").

Next, a method of manufacturing an organic semiconductor device such as described above is explained.

As shown in FIG. 4, an organic semiconductor device manufacturing method according to this invention comprises a first structural portion formation process (FIG. 4A) of forming a first structural portion 3, including an electrode, on the substrate 2. The first structural portion formation process is a process of forming the first structural portion by film deposition means employing a sputtering method, a CVD method, a printing method, or another method. This film deposition means may include pattern formation means of forming a thin film pattern, using a photoetching method or another thin film pattern formation method.

An organic semiconductor layer formation process (FIG. 4B) is performed to deposit an organic semiconductor layer 4 on at least a portion of the first structural portion 3. The organic semiconductor layer formation process is a process of depositing an organic semiconductor layer 4 using a spin-coating method, a blade coating method, an evaporation deposition method, a printing method, an inkjet method, or various other film deposition methods. In the case of materials, such as high-molecular-weight compounds, for which application of the evaporation deposition method is difficult, by using a spin-coating or a blade coating method, an organic semiconductor layer 4 with a uniform film thickness can be formed. The organic semiconductor layer 4 may be formed by combining the film deposition methods.

A second structural portion formation process (FIG. 4C) is performed to form, on the organic semiconductor layer 4, the second structural portion 5 including an electrode. Because the organic semiconductor layer 4 supporting the second structural portion 5 generally does not have heat resistance, it is preferable that the second structural portion formation process does not include a process of heating the organic semiconductor layer to high temperatures; for example, a process may be employed to deposit film by film deposition means employing evaporation deposition.

The second structural portion formation process includes a mask portion formation process to form the mask-portion made of a material having an etching resistance property. The mask portion formation process may for example be a second electrode formation process to form the second electrode.

After the mask portion formation process, an etching process (FIG. 4D) is performed to remove the organic semiconductor layer 4 not covered by the mask portion by means of etching. The etching process can use an etching means employing a dry etching method or a wet etching method.

The dry etching method is a method of physical or chemical etching of the material for etching using an active gas (etching gas). The etching gases include for example ozone ($O_3$), oxygen ($O_2$), argon (Ar), carbon tetrafluoride ($CF_4$), or a mixture of these. An etching process employing the dry etching is a process of decomposing an organic compound with ozone occurring as a result of, for example, irradiation of a gas contains oxygen with ultraviolet (UV) rays. The dry etching process may also be a process of exposing the organic compound to a plasma gas, to decompose the organic compound. Also, the etching process may be a reactive ion etching (RIE) process, in which etching is performed by accelerating and causing collisions with ionized etching gas.

The wet etching is a method of chemically or physically removing material to be etched using etching liquid capable of dissolving a thin film made of an organic compound. The etching liquid is, for example, an organic solvent capable of dissolving the organic semiconductor layer. The etching liquid may include a component to decompose an organic compound of the organic semiconductor layer.

In the cases of both the dry etching method and the wet etching method as described above, it is preferable that the etching process be performed in an environment in which there is no moisture in the vicinity of the substrate for etching, such as for example in an environment filled with an inert gas or in a vacuum. By performing etching in such a state, degradation of the organic semiconductor by moisture can be prevented.

When the organic semiconductor layer does not have heat resistance, it is necessary to prevent degradation of the material due to heating during the etching process. For example, it is desirable that the maximum temperature in the etching process be set to a temperature lower than the glass transition temperature ($T_g$), melting point, and sublimation temperature of the organic layer.

If in the etching process the mask portion is exposed to the etching gas or the etching liquid, degradation of the mask portion may occur. For example, if the mask portion is of metal or another easily oxidized material, and if etching is performed using ozone or another oxidizing substance, the metal is oxidized. In order to prevent oxidation of the mask portion, it is preferable that an oxidizing substance either not be used, or be used only in low concentrations.

When a portion of the mask portion is removed simultaneously with the organic semiconductor layer, the formation of minute holes penetrating the mask portion, and other damage may occur in the mask portion. Such damage occurs more readily when the etching rate ratio, which is the mask portion etching rate divided by the organic semiconductor layer etching rate, is high. Hence it is preferable that the etching rate ratio be 1/5 or lower, still more preferable that the ratio be 1/20 or lower, and most preferable that the ratio be 1/100 or lower. The thickness of the mask portion should be decided considering the etching rate ratio and taking into consideration the thickness to be removed by etching.

The etching process may remove a portion of the organic semiconductor layer not covered by the mask portion by etching. For example, when the organic semiconductor layer includes a plurality of organic compound layers, the etching process may be a process which etches at least one organic compound layer.

Subsequent to the etching process, a protective layer made of a material with moisture resistance or other functional layer may also be formed.

Figure 4A:
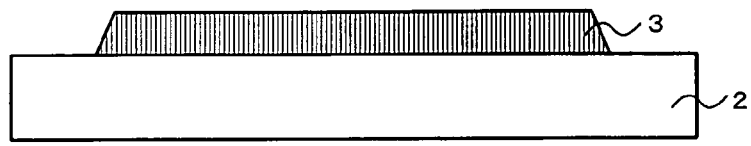
FIG. 4 is a cross-sectional view showing, in order, the processes of an organic semiconductor device manufacturing method of this invention.
Figure 4B:
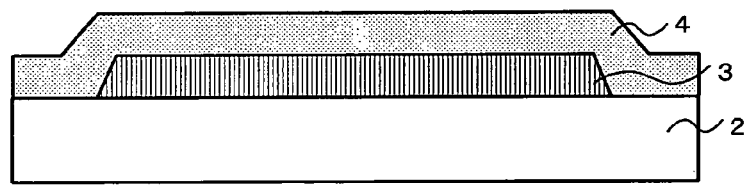
Figure 4C:
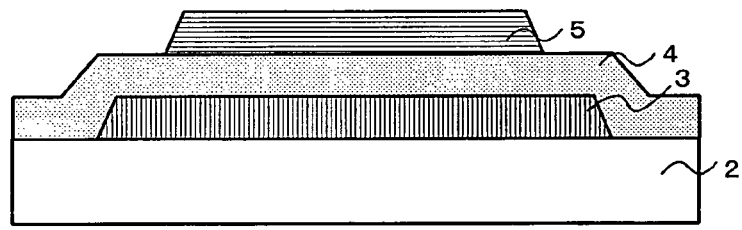
Figure 4D:
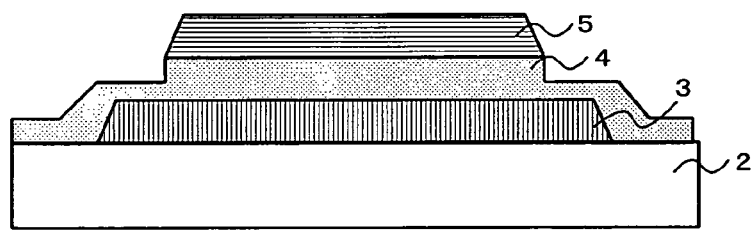
Figure 4E:
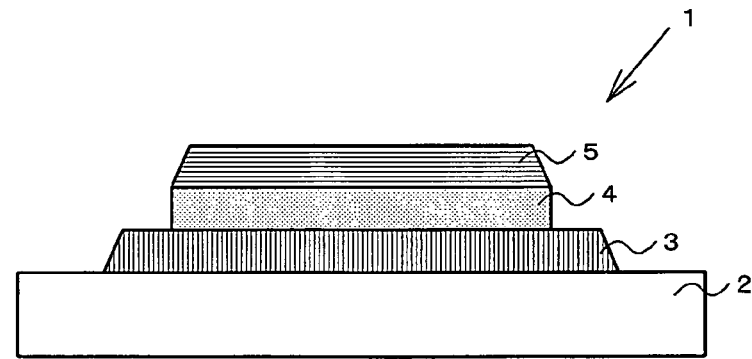

As a result of the processes, an organic semiconductor device 1 is obtained (FIG. 4E).

By means of the film deposition method used, the mask portion serves as a mask when performing etching, and is also a component of the organic semiconductor device, so that a separate process to fabricate a mask becomes unnecessary. Also, because a mask removal process such as that performed in the prior art is unnecessary, the number of processes can be reduced.

Also, because a pattern can be formed without exposure to solvents or water, an organic semiconductor layer made of a material not resistant to water can be patterned.

Figure 5:
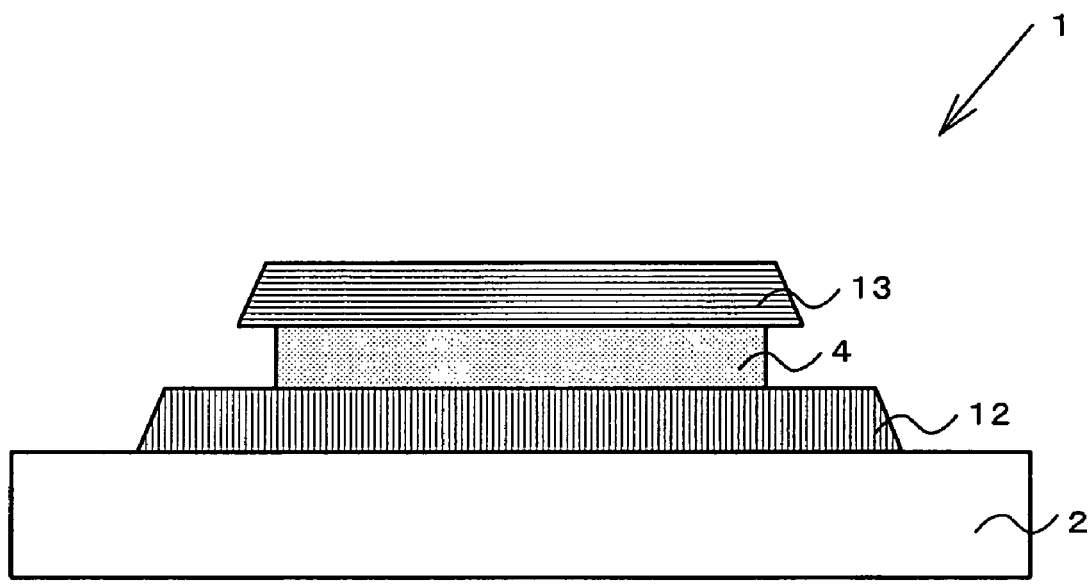
FIG. 5 is a cross-sectional view showing the side-etching occurring when performing isotropic etching.
Figure 6A:
FIG. 6 is a cross-sectional view showing a modified example of an organic semiconductor device manufacturing method of this invention.
Figure 6B:
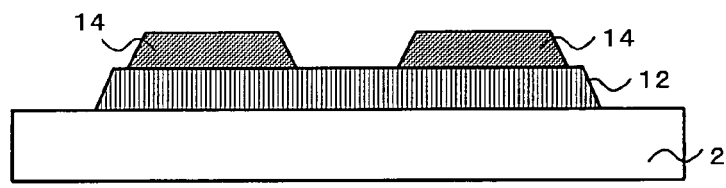
Figure 6C:
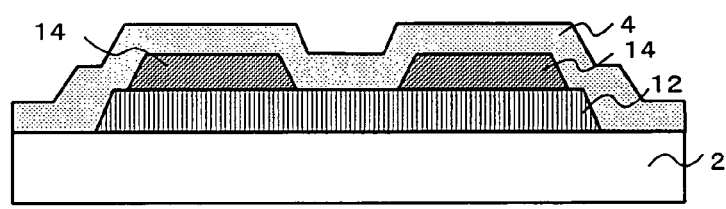
Figure 6D:
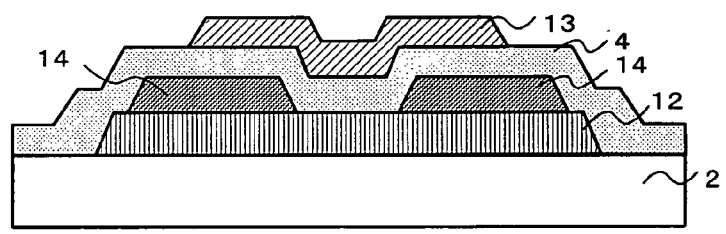
Figure 6E:
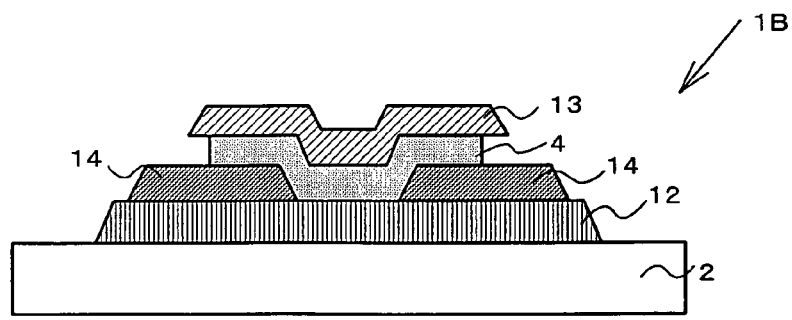
Figure 7A:
FIG. 7 is a cross-sectional view showing an organic EL display panel manufacturing method of this invention.
Figure 7B:
Figure 7C:
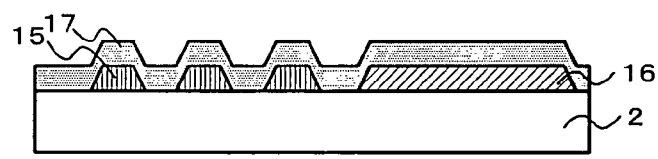
Figure 7D:
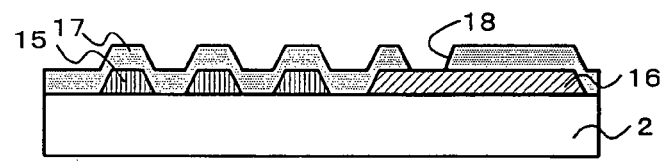
Figure 7E:
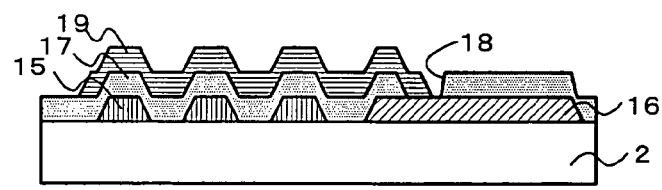
Figure 7F:
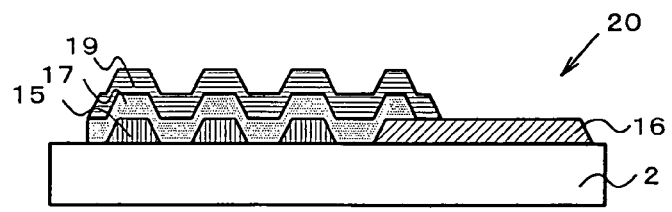
Figure 8A:
FIG. 8 is a cross-sectional view showing a full-color display panel manufacturing method of this invention.
Figure 8B:
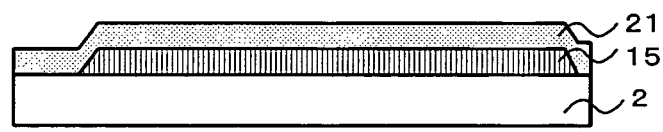
Figure 8C:
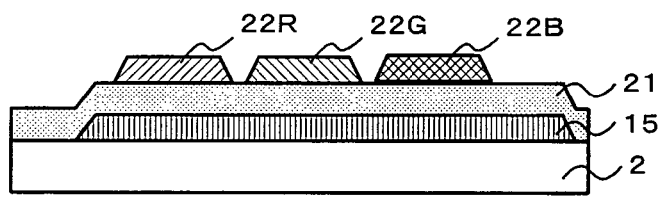
Figure 8D:
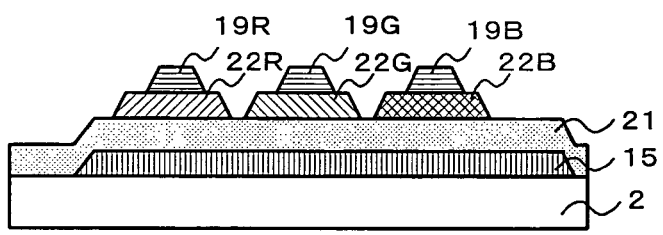
Figure 8E:
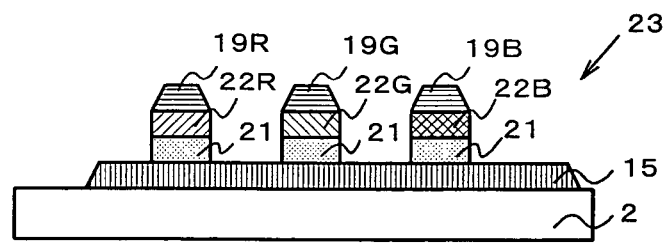

When etching proceeds isotropically in the etching process, the organic semiconductor layer 4 supporting the mask portion 13 is etched in the lateral direction from the edges of the mask portion 13, as shown in FIG. 5, in so-called side etching, to become narrower than the width of the mask portion 13.

When the mask portion 13 is the second electrode, short-circuiting can occur due to discharge across the end portion of the second electrode and the first electrode 12. A short-circuit prevention layer to prevent such short-circuits may be provided between the second electrode and the first electrode. A short-circuit prevention layer formation process to form the short-circuit prevention layer is performed between the first structural portion formation process and the second structural portion formation process.

For example, as shown in FIG. 6, after the first electrode formation process (FIG. 6A) a short-circuit prevention layer formation process (FIG. 6B) may be performed to form a short-circuit prevention layer 14 made of an insulating material. The short-circuit prevention layer formation process may be a process to form the short-circuit prevention layer 14 on the first electrode 12 by pattern formation means using, for example, a photoetching method after film deposition by a sputtering method or another film deposition method. Also, the short-circuit prevention layer formation process may be a process to form a short-circuit prevention layer 14 by depositing photosensitive material and then irradiating the material with light in a prescribed pattern. The material of the short-circuit prevention layer 14 may be made of an etching-resistant metal oxide, metal nitride, or other inorganic compound. Also, a polyimide, photoresist, or other organic compound may be used as the insulating layer material.

After the short-circuit prevention layer formation process, the organic functional layer formation process (FIG. 6C) and second electrode formation process (FIG. 6D) are performed in order, and etching is performed using the second electrode as a mask (FIG. 6E), to obtain the organic semiconductor device 1B.

Next, a method of manufacturing an organic EL display panel including a plurality of organic EL devices, using the above-described manufacturing method, is explained.

As shown in FIG. 7, an anode formation process (FIG. 7A) is performed to form an anode 15 on a substrate 2 of transparent glass. The anode formation process includes a film deposition process of depositing an indium-tin oxide (hereafter "ITO") layer of thickness 1500 Å by a sputtering method, and a pattern formation process of forming the ITO layer into a prescribed pattern. In the pattern formation process, for example, AZ6112 photoresist manufactured by Tokyo Ohka Kogyo Co., Ltd. is formed in a prescribed pattern on the ITO layer, which is immersed in a mixed solution of ferric chloride and hydrochloric acid in a process to remove the ITO portion not covered by the resist.

The anode may also be indium-zinc oxide (hereafter "IZO"), Au, Pd, or another material with a large work function.

A lead electrode formation process (FIG. 7B) to provide a lead electrode on the substrate 2 on which the anode 15 is provided, to enable connection to an external circuit, is performed. The lead electrode formation process includes a film deposition process to deposit a chromium (Cr) layer of thickness 1500 Å using a sputtering method, and a pattern formation process to form the Cr layer into a prescribed pattern. In the pattern formation process, for example, AZ6112 photoresist manufactured by Tokyo Ohka Kogyo Co., Ltd. is formed in a prescribed pattern on the Cr layer, which is immersed in an aqueous solution of ammonium cerium nitrate in a process to remove the Cr portion not covered by the resist.

After the lead electrode formation process, an organic functional layer formation process (FIG. 7C) is performed to form an organic functional layer 17 including at least one light emission layer. The organic functional layer may include such functional layers as a hole injection layer, hole transport layer, electron injection layer, electron transport layer, or the like. This functional layer may include LiF or another inorganic compound.

The organic functional layer formation process may for example include a process in which a solution of a polyaniline derivative, dissolved in an N,N-dimethyl formamide (DMF) organic solvent and with acid added, is applied by a spin-coating method, to form the layer over substantially the entire surface of the substrate. Next, the processes are performed in which a 250 Å thick α-NPD (N,N'-di-1-naphthalenyl-N,N'-diphenyl-(1,1'-biphenyl)-4,4'-diamine) layer and a 600 Å thick Alq3 (tris(8-hydroxyquinoline) aluminum)

layer are formed in order. This stacking process is for example a process of forming a pixel area using evaporation deposition employing a mask.

The organic functional layer formation process includes a window portion formation process (FIG. 7D) to remove a portion of the organic functional layer 17 on the lead electrode 16 and form a window portion 18. The window portion formation process is a process in which for example the organic functional layer is irradiated with laser light. It is preferable that the wavelength of the laser light be a wavelength at which the optical absorptivity of the substrate and the lead electrode supporting the organic functional layer is low, in order to suppress damage to the organic functional layer due to heat generated when the laser light is absorbed by the lead electrode or the like. For example, the second harmonic of YAG laser light, which is light at a wavelength of 532 nm, can be used. The window portion may also be formed by dry etching using portions other than the window portion as a mask.

After the organic functional layer formation process, a cathode formation process (FIG. 7E) to form a cathode 19 on the organic functional layer 17 is performed. In the cathode formation process, the cathode 19 is formed so as to be connected to the lead electrode 16 via the window portion 18. The cathode can be formed by a process similar to the anode formation process. However, because the layer supporting the cathode is the organic functional layer, which is not highly resistant to heat or solvents, it is preferable that a formation process such as for example evaporation deposition be used which does not damage the organic functional layer. The cathode may be Al, Al—Li alloy, Mg—Ag alloy, or another material with a small work function.

After the cathode formation process, an etching process (FIG. 7F) is performed to etch the organic functional layer 17, with the cathode 19 as a mask. The etching process is for example a dry etching process. In the dry etching process, for example, so-called plasma ashing, in which oxygen gas plasma is made to react with resist, is used to perform etching. Ozone gas may be used to cause reaction with resist in ozone ashing.

The cathode material, generally metal or another inorganic material, is highly resistant to etching compared with the organic functional layer. Hence the organic functional layer can be etched using the cathode as a mask.

By means of the above processes, an organic EL display panel 20 is obtained. Through this manufacturing method, because patterns can be formed in the display area of the panel by an etching process alone without performing a mask removal process, the number of manufacturing processes can be reduced. Also, the cathode and lead electrode can be connected simultaneously with formation of the display area.

When the organic EL display panel is a passive matrix display, because the anode and cathode is both formed in stripe shapes, it is preferable that they be formed into fine patterns. Hence the anode formation process and cathode formation process may for example include processes of pattern formation by laser irradiation. These processes may also include a process of forming partition walls, the cross-sectional shape of which is an inverse taper shape, on the anode.

Further, formation of the lead electrode and connection of the cathode and lead electrode may be performed after the etching process. For example, after the end of the etching process, the lead electrode may be formed, and a connection member to electrically connect the cathode and lead electrode may be provided. Also, when the cathode is of material which is not degraded or damaged by oxidation or the like, a lead electrode need not be provided.

A method of manufacturing an organic EL display panel which emits light in a plurality of colors is described, as a modified example. A method of manufacturing is described for a full-color display panel, in which are provided pixel areas emitting light of three colors, red (R), green (G), and blue (B), as an example.

As shown in FIG. 8, manufacturing processes for a full-color display panel include an anode formation process (FIG. 8A) to form an anode 15 on the substrate. After the anode formation process, organic functional layers including materials emitting red (R), green (G) and blue (B) light are formed.

The organic functional layers are formed by a common layer formation process (FIG. 8B), to form a common layer 21 made of material common to the materials emitting light in the above three colors, and a color-expression layer formation process (FIG. 8C) to provide, in each pixel area, color-expression layers (22R, 22G, 22B) made of materials which emit light in each of the colors.

The common layer formation process is a process to form a common layer on the entire substrate by a spin-coating method or other film deposition means. The color-expression layer formation process is a process to form a pattern of color-expression layers on the common layer by an inkjet method or other film deposition means. The color-expression layers may also be formed using such other film deposition means as a printing method or an evaporation deposition method using a mask.

The organic functional layer formation process may be a process in which, after performing a color-expression layer formation process, a common layer formation process is performed.

After the organic functional layer formation, a cathode formation process (FIG. 8D) in which cathodes (19R, 19G, 19B) are formed in each pixel area, and an etching process (FIG. 8E) in which etching is performed using cathodes as masks, are performed in order, to obtain the full-color display panel 23.

The method of manufacturing a full-color display panel may include the manufacturing processes shown in FIG. 9. These manufacturing processes include an anode formation process (FIG. 9A), followed by a process to form a red color organic functional layer 24 made of a color-expression material which emits red (R) light (FIG. 9B). A red cathode formation process (FIG. 9C) to form a red color cathode 19R on the red color organic functional layer 24 is performed. The red color cathode 19R is formed in the red color pixel area. The red color cathode 19R is used as a mask to perform etching, to form the red color pixel area (FIG. 9D).

After formation of the red color pixel, a green color organic functional layer 25 made of a color-expression material emitting green (G) light, is deposited by spin-coating or other film deposition means. A green color cathode formation process (FIG. 9E) to form a green color cathode 19G in the green color pixel area of the green color organic functional layer 25 is performed. Etching is performed using the green color cathode 19G as a mask (FIG. 9F), to form the green color pixel area.

Figure 9A:
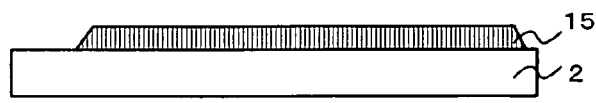
FIG. 9 is a cross-sectional view showing a modified example of a full-color display panel manufacturing method of this invention.
Figure 9B:
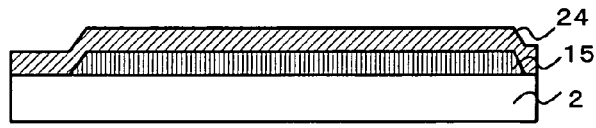
Figure 9C:
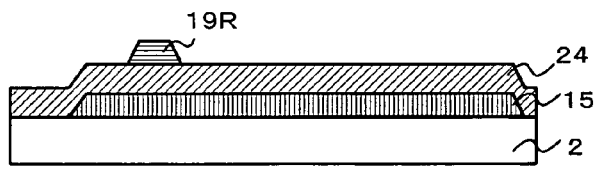
Figure 9D:
Figure 9E:
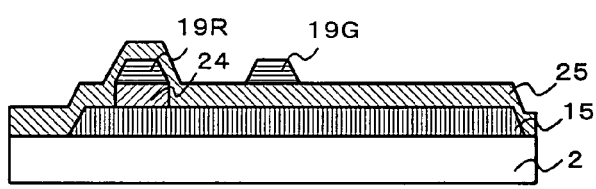
Figure 9F:
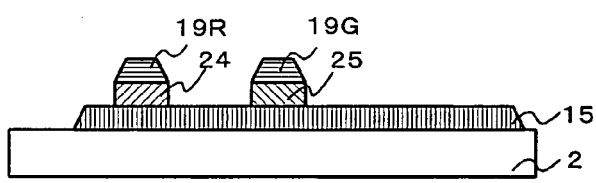
Figure 9G:
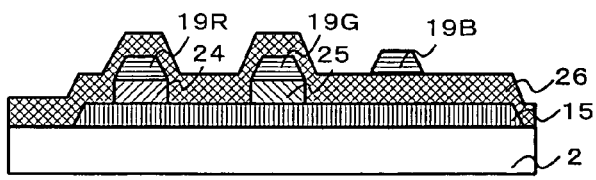
Figure 9H:
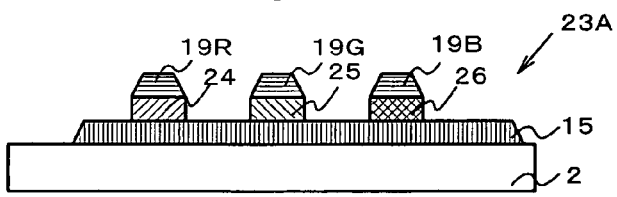
Figure 10A:
FIG. 10 is a cross-sectional view showing a modified example of an organic EL display panel manufacturing method of this invention.
Figure 10B:
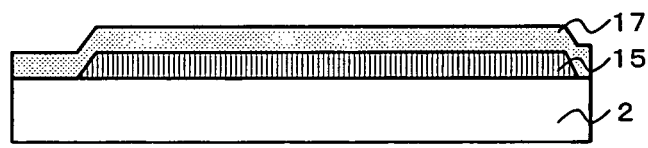
Figure 10C:
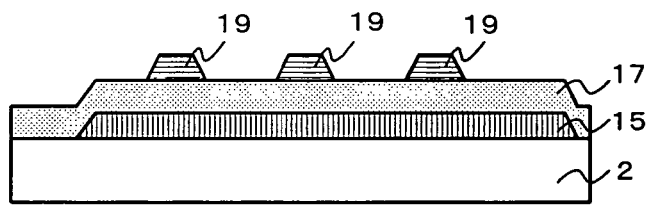
Figure 10D:
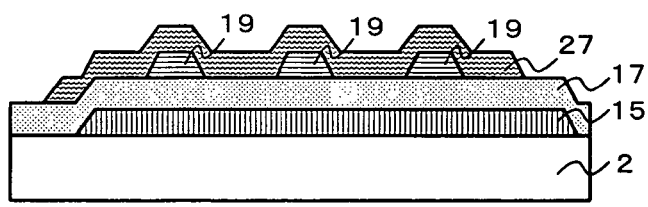
Figure 10E:
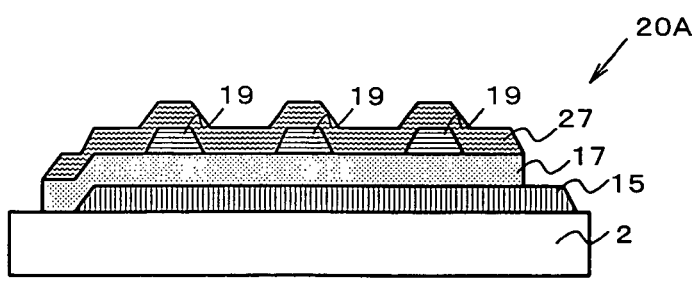

After formation of the green color pixel, a blue color organic functional layer 26 made of a color-expression material emitting blue (B) light, is formed, and a blue color cathode formation process (FIG. 9G) to form a blue color cathode 19B in the blue color pixel area is performed. Etching is performed using the blue color cathode as a mask, to form the blue color pixel area. By means of the above processes, a full-color display panel 23A is obtained (FIG. 9H).

The manufacturing processes for an organic EL display panel may include a sealing process to seal the organic functional layer. As shown in FIG. 10, after the formation on the substrate, in order, of the anode 15, organic functional layer 17 and cathode 19 (FIG. 10A through FIG. 10C), a sealing process (FIG. 10D) is performed to form a sealing layer 27 covering the organic functional layer 17. The sealing process may be a process to form a sealing layer of silicon nitride using a CVD method. The sealing layer is made of a material having an etching-resistant property. It is preferable that the sealing layer have moisture resistance. By covering the organic functional layer with a sealing layer having moisture resistance, the occurrence of degradation of the organic functional layer due to moisture can be prevented.

After formation of the sealing layer, the etching process (FIG. 10E) is performed using the sealing layer 27 as a mask, to obtain an organic EL display panel 20A. By providing the sealing layer, degradation of the organic functional layer during etching can be prevented.

Figure 11A:
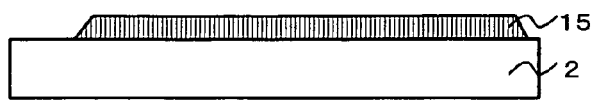
FIG. 11 is a cross-sectional view showing a modified example of an organic EL display panel manufacturing method of this invention.
Figure 11B:
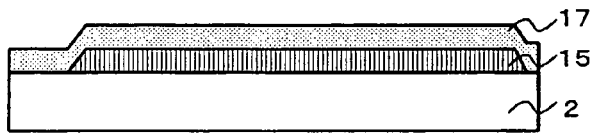
Figure 11C:
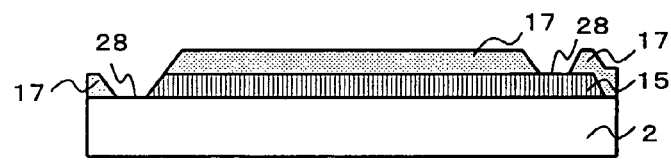
Figure 11D:
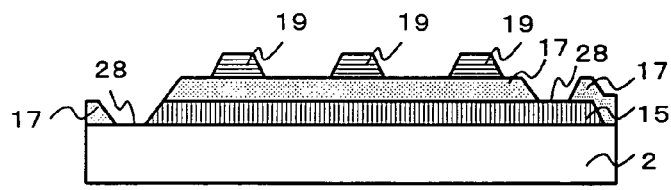
Figure 11E:
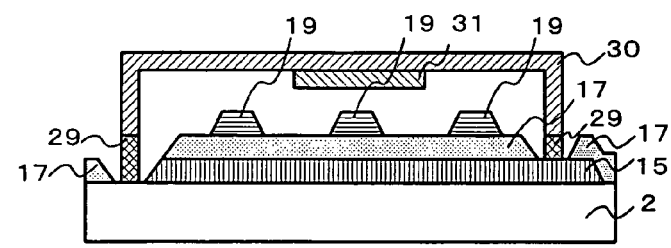

The sealing process may be a process of sealing the organic functional layer by bonding a sealing can to the substrate. For example, as shown in FIG. 11, a sealing process using a sealing can is performed after providing the anode 15 on the substrate 2 (FIG. 11A) and forming the organic functional layer 17 on the anode 15 (FIG. 11B).

A bonding area formation process (FIG. 1C) is performed to remove a portion of the organic functional layer 17 and provide a bonding area 28 for bonding of the sealing can. To form the bonding area 28, for example a dry etching method or removal by irradiation with laser light can be used.

After the bonding area formation process, the cathode formation process (FIG. 1D) is performed, an adhesive 29 is deposited in the bonding area 28, and the sealing can 30 is bonded (FIG. 1E). The sealing can 30 is made of a material having a concave portion, and having moisture resistance. For example, the sealing can may be made of a glass sheet or stainless steel. Also, a desiccant 31 of BaO may be affixed to the interior of the concave portion. Bonding of the sealing can may also be performed using an adhesive made of for example an ultraviolet-hardening type epoxy resin. It is preferable that the adhesive have an etching-resistant property.

Figure 11F:
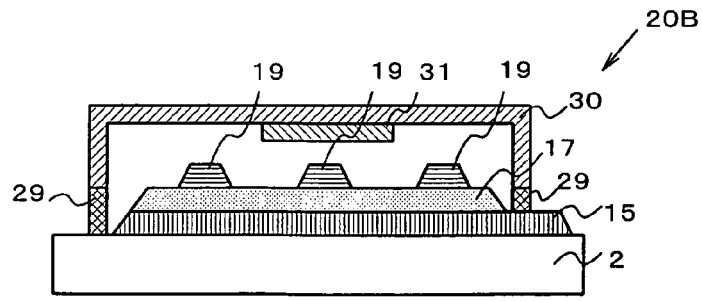
Figure 12A:
FIG. 12 is a cross-sectional view showing a modified example of an organic EL display panel manufacturing method of this invention; and, FIG. 13 is a cross-sectional view showing an organic TFT manufacturing method of this invention.
Figure 12B:
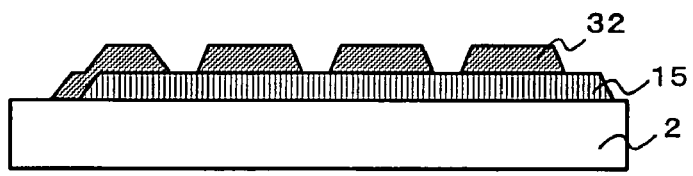
Figure 12C:
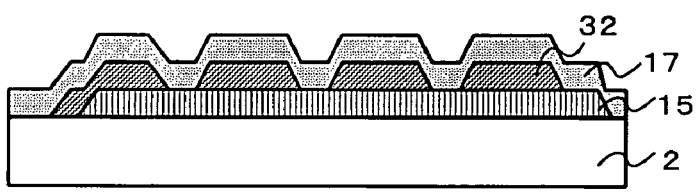
Figure 12D:
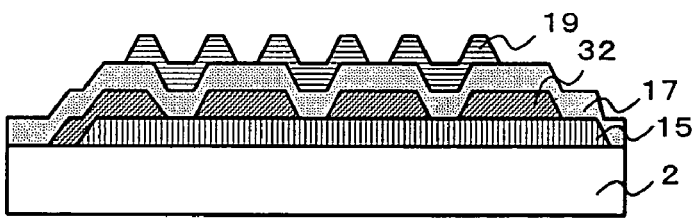
Figure 12E:
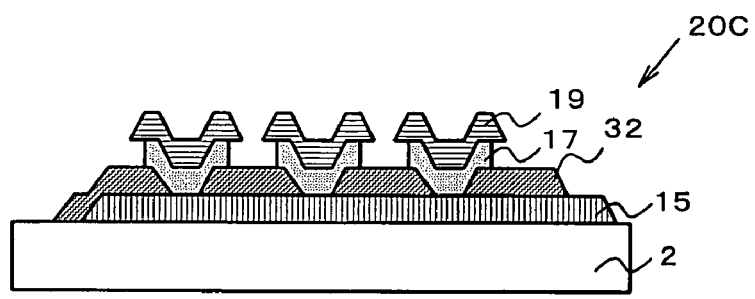

The sealing can 30 is used as a mask to perform etching, to obtain the organic EL display panel 20B (FIG. 11F).

A short-circuit prevention layer of material having an insulating property may also be formed between the cathode end portion and the anode. For example, as shown in FIG. 12, after the anode formation process (FIG. 12A), a short-circuit prevention layer formation process (FIG. 12B) to form a short-circuit prevention layer 32 is performed.

The short-circuit prevention layer formation process includes a film deposition process, in which for example spin-coating or other film deposition means are used to deposit the polyimide PIX-1400 manufactured by Hitachi Chemical Co., Ltd. on the substrate, and this polyimide layer is then caused to adhere by heating. After the film deposition process, a pattern formation process is performed to form the polyimide layer into a pattern. The pattern formation process may for example include a process of forming a resist layer of AZ6112 photoresist manufactured by Tokyo Ohka Kogyo Co., Ltd. in a prescribed pattern on the polyimide layer, of developing the resist layer using NMD-3 manufactured by Tokyo Ohka Kogyo Co., Ltd., and of performing etching of the polyimide layer. After the etching, the resist layer is removed by immersing the substrate in butyl acetate, and the polyimide layer is cured.

After the short-circuit prevention layer formation process, the organic functional layer formation process (FIG. 12C) and cathode formation process (FIG. 12D) are performed in order. The cathode 19 is used as a mask to perform etching (FIG. 12E), to obtain the organic EL display panel 20C.

The organic EL display panel of the above embodiment may also be configured providing, in order from the substrate, the cathode, organic functional layer, and anode.

A method of manufacturing a TFT using an organic semiconductor device according to this invention is explained.

Figure 13A:
Figure 13B:
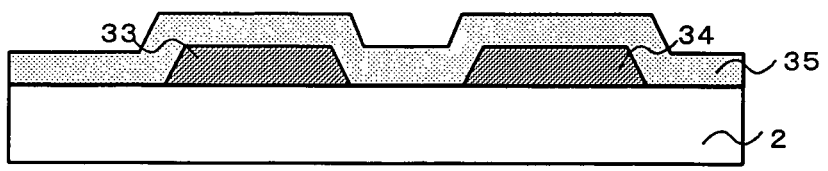
Figure 13C:
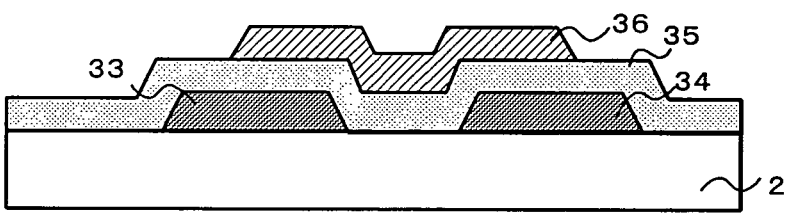
Figure 13D:
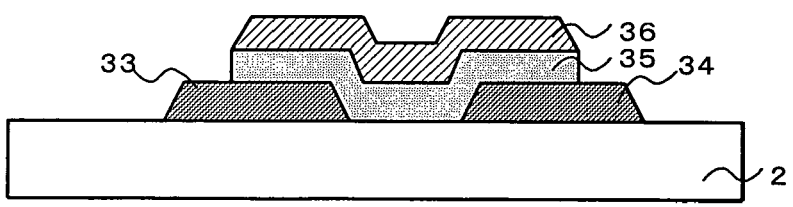
Figure 13E:
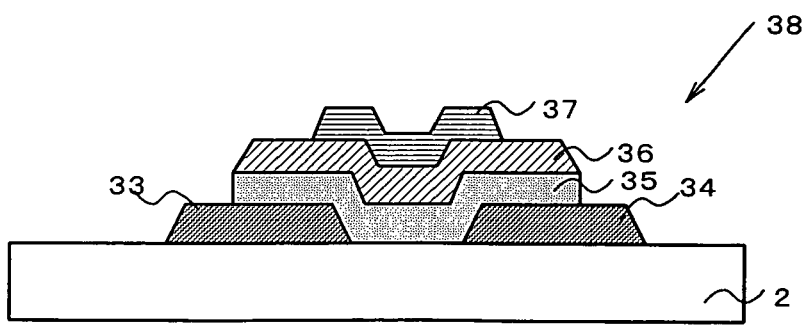

As shown in FIG. 13, a source electrode 33 and drain electrode 34 are formed on the substrate 2 (FIG. 13A). The source/drain electrode formation process includes a film deposition process to form a thin film of gold (Au) of thickness 2000 Å by for example a sputtering method, and a resist pattern formation process to form a photoresist pattern on the gold thin film. The source/drain electrode formation process includes an etching process to remove by etching the portion of the gold not covered by the resist, by immersing the substrate on which the resist pattern is formed in an iodine solution. Following the etching process, the substrate is immersed in acetone to remove the resist, and the patterns of the source electrode and drain electrode are formed on the substrate.

The source electrode and drain electrode are formed of a low-resistance material. For example, Al, Ag, Cu or another metal, an alloy, or a conductive polymer may be used.

After the source/drain electrode formation process, an organic semiconductor layer formation process (FIG. 13B) is performed to form the organic semiconductor layer 35 using evaporation deposition or another film deposition method. The organic semiconductor layer is for example a pentacene layer of thickness 1000 Å. The organic semiconductor layer includes a material having electron transport properties or hole transport properties. For example, thiophene, phthalocyanine, oligothiophene, polythiophene, or a derivative thereof may be used.

After the organic semiconductor layer formation process, a gate insulating layer formation process (FIG. 13C) to provide a gate insulating layer 36 is performed. This gate insulating layer formation process is a process to form, for example, 2000 Å thick silicon nitride film by sputtering using a mask. A gate insulation film, of width 1 mm in the channel direction in the channel portion, is obtained.

It is preferable that the gate insulating layer be of a material with high insulating properties. The gate insulating layer may be made of a metal oxide, metal nitride or other inorganic material, or a polyimide, photoresist or other resin, or these combinations. It is also preferable that the gate insulating layer has an etching-resistant property.

An etching process (FIG. 13D) is performed to etch the organic semiconductor layer 35 using the gate insulating layer 36 as a mask. The etching process is a process to perform etching using a plasma ashing method; for example, a parallel-plate type plasma ashing system can be used.

After the end of the etching process, the gate electrode formation process (FIG. 13E) to form a gate electrode 37 on the insulating layer is performed. The gate electrode formation process is a process in which a 1000 Å thick Cr layer is formed by sputtering using a mask, and the Cr layer is patterned into a gate electrode, of width 0.5 mm in the channel length direction in the channel portion.

On passing through the above processes, the organic TFT 38 is completed.

The gate electrode formation process may be performed before the etching process. Also, the etching process may use the gate electrode as a mask. By using the gate electrode as a mask, the gate insulating layer formation process need not have a pattern formation process, so that the number of processes can be reduced.

Further, a short-circuit prevention layer to prevent short-circuits between the source electrode or drain electrode and the gate electrode may be provided. The short-circuit prevention layer formation process to provide the short-circuit prevention layer is performed between the source/drain electrode formation process and the gate electrode formation process. For example, after the source/drain electrode formation process, the short-circuit prevention layer may be provided on the source electrode and drain electrode.

By means of an organic semiconductor device according to this invention, including: a first structural portion having a first electrode; an organic semiconductor layer made of an organic compound having a semiconductor property; and a second structural portion confronting the first structural portion via the organic semiconductor layer and having a second electrode; wherein the second structural portion has a mask portion made of a material having an etching-resistant property, wherein the organic semiconductor layer is formed in a pattern by etching while using the mask portion as a mask, the pattern of the organic semiconductor layer is formed using the pattern of the mask portion included by the organic semiconductor device, so that there is no mismatch between the patterns of the mask portion and the organic semiconductor layer, and the organic semiconductor device can be manufactured reliably.

By means of an organic semiconductor device manufacturing method according to this invention, which is a method of manufacturing a semiconductor device including a first structural portion having a first electrode, an organic semiconductor layer made of an organic compound having a semiconductor property, and a second structural portion confronting the first structural portion with the organic semiconductor layer and having a second electrode, including: a first structural portion formation process of forming the first structural portion; an organic semiconductor layer formation process of forming the organic semiconductor layer on the first structural portion; and a second structural portion formation process of forming the second structural portion on the organic semiconductor layer, wherein the second structural portion formation process having a mask portion formation process of forming a mask portion made of a material having an etching-resistant property, and an etching process of etching the organic semiconductor layer while using the mask portion as a mask, the mask portion forming the pattern of the organic semiconductor layer is a member included by the organic semiconductor device, so that a process to remove the mask is unnecessary, and therefore the number of processes can be reduced.

What is claimed is:

1. A method of manufacturing an organic electroluminescence display panel, including a substrate, and at least one of organic electroluminescence elements having a first structural portion having a first electrode formed on/over said substrate, an organic semiconductor layer made of an organic compound having a semiconductor property, and a second structural portion confronting said first structural portion with said organic semiconductor layer and having a second electrode, wherein the organic electroluminescence display panel further comprising a lead electrode formed on/over said substrate and connected to said second electrode, the method comprising:

a first structural portion formation process of forming said first structural portion on said substrate;
an organic semiconductor layer formation process of forming said organic semiconductor layer on said first structural portion;
a second structural portion formation process of forming said second structural portion on said organic semiconductor layer; and
an etching process of etching said organic semiconductor layer while using a mask,
wherein further comprising a process of removing a portion of said organic semiconductor layer before making the mask,
the method of manufacturing an organic electroluminescence display panel further comprising a lead electrode formation process of forming said lead electrode on said substrate;
wherein said organic semiconductor layer formation process including the process of removing a portion of said organic semiconductor layer on said lead electrode and of forming a window portion; and
wherein said second structural portion formation process including a second electrode formation process of forming said second electrode connected to said lead electrode via said window portion, and the etching process of etching said organic semiconductor layer while using said second electrode as the mask.

2. A method of manufacturing an organic electroluminescence display panel, including a substrate, and at least one of organic electroluminescence elements having a first structural portion having a first electrode formed on/over said substrate, an organic semiconductor layer made of an organic compound having a semiconductor property, and a second structural portion confronting said first structural portion with said organic semiconductor layer and having a second electrode, comprising:

a first structural portion formation process of forming said first structural portion on said substrate;
an organic semiconductor layer formation process of forming said organic semiconductor layer on said first structural portion; and
a second structural portion formation process of forming said second structural portion on said organic semiconductor layer, and
an etching process of etching said organic semiconductor layer while using a mask,
wherein further comprising a process of removing a portion of said organic semiconductor layer before making the mask,
wherein said second structural portion formation process including the process of removing a portion of said organic semiconductor layer and providing a bonding area, a second electrode formation process of forming said second electrode on said organic semiconductor layer, a sealing process of bonding a sealing can to said bonding area and sealing said organic electroluminescence elements, and the etching process of etching said organic semiconductor layer while using said sealing can as the mask.

* * * * *